Nov. 3, 1970 A. C. CHEN 3,537,925

METHOD OF FORMING A FINE LINE APERTURED FILM

Filed March 14, 1967

Inventor:
Arthur C. Chen, by John J. Kessane
His Attorney.

United States Patent Office 3,537,925
Patented Nov. 3, 1970

3,537,925
METHOD OF FORMING A FINE LINE APERTURED FILM

Arthur C. Chen, Niskayuna, N.Y., assignor to General Electric Company, a corporation of New York
Filed Mar. 14, 1967, Ser. No. 623,094
Int. Cl. C23f 1/02
U.S. Cl. 156—6 4 Claims

ABSTRACT OF THE DISCLOSURE

An apertured film having a line of narrow width, e.g., 3 microns, is produced by a process which includes the evaporation of a 2000 A. thick film of tin upon a glass substrate, the coating of the tin film with a layer of photoresist, and the partial removal of the photoresist adjacent the desired location of the line aperture to expose a portion of the underlying tin film. The partially masked tin film then is etched in a dilute solution of hydrochloric acid and nitric acid for a period of one second to dissolve the exposed tin film and undercut the photoresist by a distance of 3 microns. After a second 2000 A. thick layer of tin is deposited atop both the photoresist and partially uncovered substrate, the photoresist is softened by soaking the coated substrate in an organic solvent for approximately 3 minutes. The photoresist and that portion of the second layer of tin overlying the photoresist is subsequently removed by the low pressure spraying of the organic solvent upon the substrate thereby forming a fine line apertured film. When metal films having poor adhesion to the substrate are to be utilized to form the fine line apertured film, a seeding film such as nickel, tin or chromium is deposited upon the substrate prior to the deposition of the metal films forming the fine line apertured film to improve the adhesion of the apertured film to the substrate.

This invention relates to a method of forming fine line apertured films for microelectronics and in particular to the formation of fine line apertured films by the utilization of the undercutting produced by the etching of a partially masked film.

Many semiconductor devices such as thin film transistors, diodes and certain integrated circuits are formed by a process which includes the etching of limited sections of a generally planar material utilizing a minutely apertured masking material overlying the planar material. Optically etchable organic compounds, e.g., photoresists, are commonly employed as the masking material and the minute apertures in the photoresist are formed by selectively illuminating a portion of the photoresist through a partially exposed photographic film. When the line dimensions to be etched in the photoresists are of widths less than 1 mil however, expensive high resolution photographic equipment is required to form the photographic film mask for the photoresist. Furthermore, the photographic film utilized in optically etching the photoresist often exhibits a contrast gradient at the borders of the exposed portions of the film because the developing light rays expose an entire silver halide particle upon impingement notwithstanding the extension of a portion of the silver halide particle beyond the developing light path. Similarly, the formation of sharp fine line apertures between metallic films is important in the construction of thin film transistors wherein the operational speed, i.e., the gain-bandwidth product, is determined by the width of the fine line aperture between the metallic electrodes forming the source and drain of the transistor.

It is therefore an object of this invention to provide an inexpensive method of forming fine line apertured films having very small apertures.

It is also another object of this invention to provide a method of forming fine line apertured films having sharply contrasting demarcation lines at the borders of the line apertures.

These and other objects of this invention generally are accomplished by the utilization of the undercutting which occurs during the etching of a partially masked film. Thus, in accordance with the method of this invention, a partially masked film is etched rapidly by a solvent to dissolve the exposed portion of the film and to undercut the masking by a distance equal to the desired line thickness for the fine line apertured film. After an additional film is deposited atop and beyond the edge of the masking overlying the undercutting, the masking and that portion of the additional film overlying the masking is stripped away from the remainder of the structure to form the apertured film of this invention. When photoresist is used as the masking material, the stripping is accomplished by softening the photoresist in a suitable organic solvent and mechanically removing, preferably by spray pressure, the softened photoresist from the underlying film. If the adhesion of the additional film to the substrate is poor, a seeding film is deposited atop the substrate prior to the depositions of the additional film to inhibit peeling of the film from the substrate during the stripping operation.

The features of this invention believed to be novel are set forth with particularity in the appended claims. The invention itself, however, both as to organization and method of operation, together with further objects and advantages thereof, may best be understood by reference to the following description taken in connection with the accompanying drawings in which:

Figure 1:
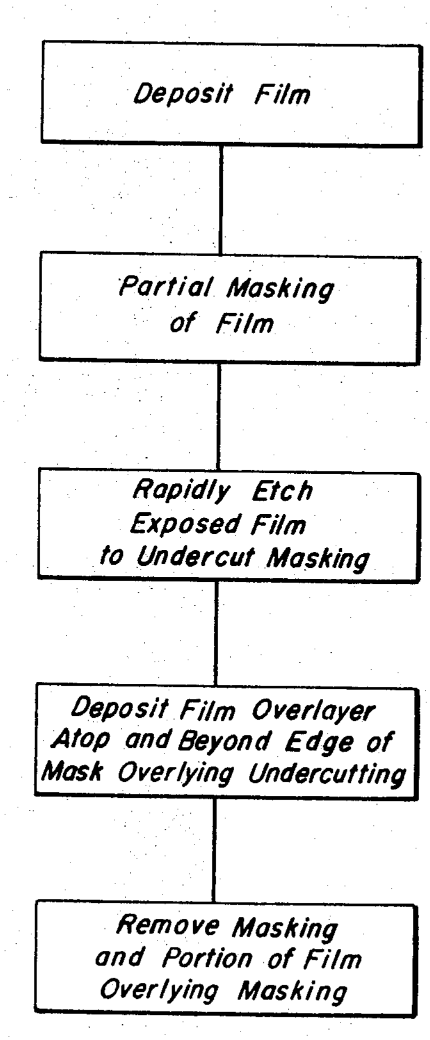
FIG. 1 is a block diagram depicting the method of this invention.

The method of this invention, as depicted in FIG. 1, generally includes the rapid etching of a partially masked film to undercut the masking and the deposition of a film overlayer atop and extending beyond the edge of the masking overlying the undercutting. The masking and the portion of the film overlayer situated atop the masking then are removed by suitable means compatible with the composition and thickness of the films to form the fine line apertured film of this invention.

Figure 2:
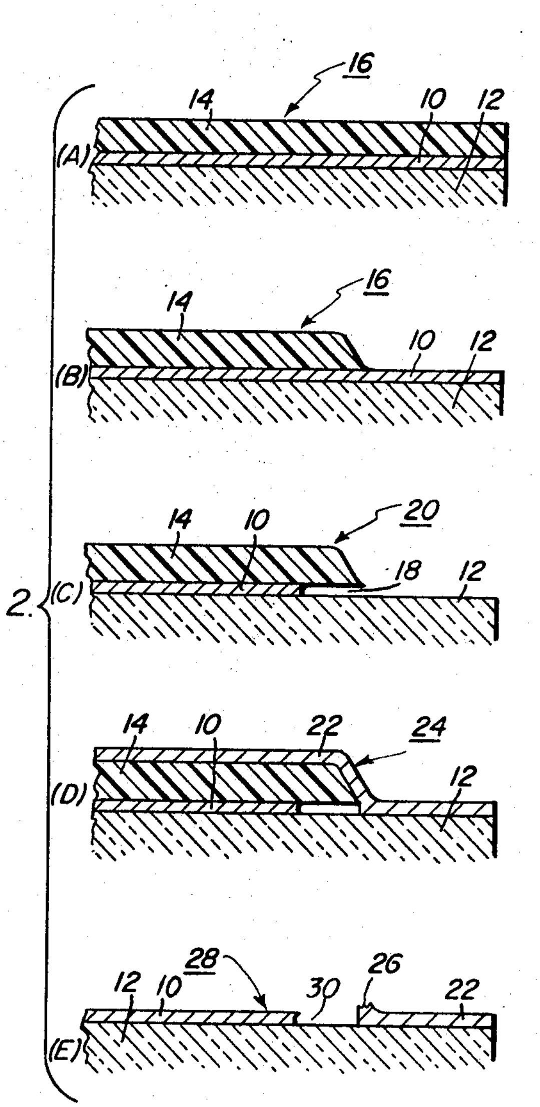
FIG. 2 is a portrayal of the sequential formation of the apertured film of this invention.

The sequential formation of the apertured film, as depicted in FIG. 2, therefore encompasses deposition of a tin film 10 upon a substrate 12, e.g., transparent glass, and the subsequent coating of the tin film with a layer of photoresist 14 to form the laminated structure 16 portrayed in FIG. 2A. Tin generally is preferred in the formation of fine line apertured films having line aperture widths greater than 3 microinches because of the ease in working with tin films on glass substrates. For line apertures below 3 microinches, other metals such as gold are favored because the relatively slow dissolution rate of gold permits greater control of small tolerances in the dimensions of the line apertures. Tin film 10 is deposited to a desired thickness of approximately 2000 A., for example, while photoresist 14 is applied atop the tin film by any one of the known conventional methods such as whirl coating, spray coating or dip coating. After the photoresist has dried, a portion of the photoresist is removed, as portrayed in FIG. 2B, preferably by exposing and chemically developing a portion of the photoresist to expose a portion of tin film 10 adjacent the desired location of the fine line within the apertured film. Other suitable methods of partially coating tin film 10, e.g., the masking of a portion of the tin film before coating the film with photoresist and the subsequent removal of the masking, also can be employed in the performance of the method of this invention.

Partially protected tin film 10 then is dipped within a suitable etchant for a sufficient period to dissolve the exposed portion of the tin film and to undercut the photoresist by a distance equal to the desired width of the fine line within the apertured film. When tin film 10 is deposited to a thickness of 2000 A., immersion within a solution of 50 cc. hydrochloric acid, 100 cc. nitric acid and 850 ml. of water for a period of 3 seconds has been found to dissolve the exposed portion of the tin film and undercut the photoresist, as shown by reference numeral 18, by a distance of 3 microns.

The etching period required to undercut a partially protected film by a given distance generally is dependent upon such parameters as the composition of the film and the concentration of the etching solution utilized. In actual practice, an empirical determination adequately serves to ascertain the optimum values of the parameters for an undercutting of a given distance. The etched structure 20, portrayed in FIG. 2C, is removed from the etching solution after expiration of the required time interval to undercut photoresist 14 by the dimension desired for the width of the fine line of the mask and the structure is rinsed in distilled water to prevent any further erosion of tin film 10.

An overlying tin film 22 then is deposited atop etched structure 18 with the deposition continuing until the overlying tin film has attained a depth of approximately 2000 A. to form the laminated structure 24 depicted in FIG. 2D. After completion of the deposition of overlying tin film 22, laminated structure 24 is immersed in a suitable organic solvent to soften photoresist 14 whereupon photoresist 14 and that portion of film 22 overlying the photoresist is subsequently stripped away by the low pressure spraying of the organic solvent upon the substrate. Because photoresist 14 has been softened by the organic solvent and has been loosened from tin film 10, the break 26 in overlying tin film 22 produced by stresses impressed upon overlying tin film 22 by the force of the propelled spray occurs proximate the initial point of adhesion of the overlying film to substrate 12. Other suitable methods, such as the agitation of laminated structure 24 within the organic solvent, also can be employed to strip from the laminated structure both photoresist 14 and the portion of film 22 overlying the photoresist.

The fine line apertured film 28, depicted in FIG. 2E, then is rinsed in distilled water to remove any residual solids which would interfere with subsequent utilization of the apertured film for such microelectronic purposes as the source and drain electrodes of thin film transistors.

Although masking layer 14 is described specifically as being a photoresist and layers 10 and 22 are described as tin films, any metallic or nonmetallic material can be employed for the respective layers dependent upon the desired usage for the fine line film. However masking layer 14 should be relatively insoluble in the etchant employed to dissolve film 10 while being soluble in a solvent relatively non-corrosive to films 10 and 22. Overlying film 22 preferably is a soft material to break under relatively small stress while being sufficiently adherent to substrate 12 that the overlaying film will not peel from the substrate during the stripping process.

Figure 3:
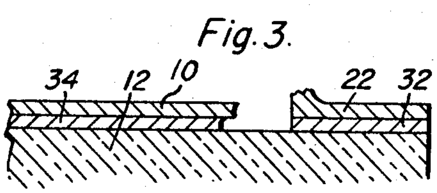
FIG. 3 is a sectional view of a fine line apertured film having a seeding film intermediate the film and the substrate to increase the adhesion of the apertured film to the substrate.

When it is desired to increase the adhesion of overlaying film 22 to substrate 12 in order to inhibit peeling of the overlaying film from the substrate during removal both of photoresist 14 and of the portion of overlying film 22 situated atop the photoresist, a seeding film 32 is deposited upon substrate 12 prior to the deposition of overlaying film 22 as depicted in FIG. 3. The particular metal utilized as seeding film 32 generally is determined both by the substrate material and by the metal used for overlying film 22 and generally extends to a depth between 50 A. and 200 A. A seeding film 34 also can be deposited upon substrate 12 prior to the deposition of tin film 10 if increased adhesion between tin film 10 and the substrate is desired.

The following examples illustrate the employment of the method of this invention to form fine line evaporation masks utilizing various metallic films.

EXAMPLE I

A clean glass substrate and a source of tin were placed in an evaporation chamber evacuated to approximately $1\times10^{-6}$ torr and the tin source was heated to deposit a 2000 A. tin film upon the glass substrate. The tin film then was removed from the deposition chamber and whirl coated with a layer of AZ 1350 photoresist made by the Shipley Company, of Norton, Mass. After the photoresist had been dried, optically exposed, and chemically removed from one side of the desired location for the fine line in the apertured film, the tin film was immersed in a solution of 50 cc. hydrochloric acid, 100 cc. nitric acid, and 850 ml. water for a period of one second to etch the exposed tin and undercut the edge of the photoresist mask by approximately 3 microns. After rinsing the etched film in distilled water, the film again was placed in the deposition chamber and a second 2000 A. thick layer of tin was deposited both upon the photoresist and upon the portion of the glass substrate which had been recently etched clean. The composite structure then was removed from the deposition chamber and immersed within a solution of AZ remover sold by the Shipley Company of Norton, Mass., to soften the photoresist sufficiently so that the photoresist and the potrion of the second layer of tin overlying the photoresist was removed by the spray pressure of the Shipley Company AZ remover spray thereby exposing a fine line of 3 microns at the location where the undercutting of the photoresist was accomplished. Because the tin used in the deposition of the metallic films had relatively good adhesion to the glass substrate, there was no necessity to seed the glass substrate with a more adhesive metal prior to the deposition of the tin films in order to inhibit peeling of the film from the substrate during the removal process. No noticeable contrast gradient was observed at the borders of the fine line aperture in the film when light was projected upon the apertured metallic film.

EXAMPLE II

A clean glass substrate, a source of lead and a source of tin were placed in an evaporation chamber and the chamber was evacuated to a pressure of approximately $1\times10^{-6}$. After evacuation of the chamber, the tin source was heated to deposit a 200 A. thick film atop the substrate whereupon the heating of the tin was discontinued. The lead source then was evapoarted to form a 1500 A. thick film overlying the tin and, after the deposition of a 200 A. layer of tin atop the lead, a layer of AZ 1350 photoresist was whirl coated over the exterior layer of tin. The layer of tin intermediate the lead and the substrate functioned as a seeding film to increase the adhesion of the lead to the glass substrate while the upper layer of tin atop the lead served to inhibit oxidation of the lead film.

After the photoresist had dried, a portion of the photoresist was optically exposed and chemically removed from atop the laminated film proximate the desired location of the fine line. The laminated film then was placed in a solution of 50 cc. hydrochloric acid, 100 cc. nitric acid, and 850 ml. water to etch the tin for a period of one second thereby partially exposing the underlying lead film. The partially exposed lead film then was rinsed in distilled water and placed in a solution of 750 ml. water, 200 ml. acetic acid and 500 ml. hydrogen peroxide for a period of 4 seconds to dissolve the exposed lead and produce an undercutting of the photoresist by approximately 4 microns. After the exposed lead had been dissolved, the substrate was rinsed and deposited in a solution of 50 cc. hydrochloric acid, 100 cc. nitric acid, and 850 ml. water for one second to dissolve the exposed portion of the bottom layer of tin and partially cut back the top layer of tin.

The glass substrate, partially covered by a photoresist mask undercut by the laminated lead and tin films, then was returned to the evaporation chamber and a 1900 A. thick layer of tin was deposited atop both the photoresist and exposed portion of the substrate. After deposition of the tin overlayer, the structure was immersed in a solution of AZ removed for a period of approximately 3 minutes to soften the photoresist which then was stripped away by the low pressure of commercially available AZ remover spray. In removing the photoresist, the portions of the deposited film of tin which was situated atop the photoresist also was removed to expose a line approximately 4 microns wide located at the undercutting of the photoresist by the lead. Because the tin etched more rapidly than the lead, the tin undercut the photoresist more deeply than the lead and did not affect the size of the fine line. No noticeable contrast gradient was observed at the borders of the fine line apertured film.

EXAMPLE III

A clean glass substrate, a source of gold and a source of nickel were placed in an evaporation chamber evacuated to about $1 \times 10^{-6}$ torr. After the nickel was evaporated and a 200 A. thick film condensed atop the substrate, a gold film was deposited atop the nickel to form a laminated film having an overall thickness of approximately 1200 A. The laminated metallic film was whirl coated with a layer of AZ 1350 photoresist which, upon drying, was exposed and chemically removed to present an edge terminating proximate the location desired for the fine line of the apertured film. The partially masked laminated film was placed in a solution of Techni Strip Au made by the Technic, Inc., Chicago, Ill., for a period of 10 seconds to dissolve the exposed portion of the gold film and undercut the photoresist by approximately 2 microns. After rinsing in water, the etched laminated film was immersed within a dilute solution of ferric chloride to remove the nickel seeding film exposed by the prior dissolution of a portion of the gold film.

The etched structure was removed from the etching solution, rinsed in distilled water and again placed within the evaporation chamber for the sequential deposition of a 200 A. layer of chromium and a 1000 A. layer of gold atop the photoresist and the clean portion of the substrate. Upon completion of the depositions, the structure was soaked in a solution of AZ remover for a period of approximately 3 minutes to soften the photoresist which photoresist was subsequently removed from the structure by the spray pressure of Shipley Company AZ remover spray. The layers of gold and chromium overlying the photoresist also was removed during the photoresist removal, with the chromium providing sufficient adhesion to the glass substrate to inhibit peeling of the portion of the deposited gold overlying the substrate. A thin film having a fine line measuring approximately 2 microns in width was obtained.

Although the method of this invention has been described specifically with reference to the forming of straight fine lines for purposes of clarity, the method of this invention also can be utilized to form curved lines or orthogonally positioned fine lines in complex circuitry when such configuration is desired.

While several examples of this invention have been shown and described, it will be apparent to those skilled in the art that many changes and modifications may be made without departing from this invention in its broader aspects; and therefore the appended claims are intended to cover all such changes and modifications as fall within the true spirit and scope of this invention.

What I claim as new and desire to secure by Letters Patent of the United States is:

1. A method of forming a fine line apertured film comprising depositing a metallic film atop a nonconductive substrate, partially shielding said metallic film with a mask of photoresist material disposed in overlying contact relative to a portion of said film and terminating adjacent the desired location of the fine line aperture etching said partially masked film to undercut said photoresist mask thereby defining the desired line aperture, depositing an additional metallic film atop and extending beyond the edge of said masking overlying said undercutting, and stripping away said masking and the portion of said additional film overlying said masking by chemically softening said photoresist and removing said softened photoresist from the underlying film.

2. A method of forming a fine line apertured film according to claim 1 further including the deposition of a seeding film atop the portion of said substrate exposed by said etching prior to the deposition of said additional film to enhance the adhesion of said additional film to said substrate.

3. A method of forming a fine line apertured film according to claim 1 wherein said initial film of conductive material is deposited by evaporation atop a glass substrate and said stripping away includes applying a gentle spray of solvent to remove said photoresist and said overlying metallic film.

4. A fine line apertured film formed by the method of claim 1.

References Cited

UNITED STATES PATENTS

| | | | |
|---|---|---|---|
| 1,922,434 | 8/1933 | Gundlach | 156—11 XR |
| 3,210,226 | 10/1965 | Young | 156—11 |

JACOB H. STEINBERG, Primary Examiner

U.S. Cl. X.R.

117—5.5; 156—3, 5, 24